United States Patent
Wojciechowski et al.

[11] Patent Number: 5,175,532
[45] Date of Patent: * Dec. 29, 1992

[54] OPTICAL DRILL COLLAR POSITION VERIFIER

[75] Inventors: Thomas G. Wojciechowski, Oak Lawn; John B. Portzer, Elmhurst, both of Ill.

[73] Assignee: AG Communication Systems Corporation, Phoenix, Ariz.

[*] Notice: The portion of the term of this patent subsequent to Aug. 20, 2008 has been disclaimed.

[21] Appl. No.: 617,314

[22] Filed: Nov. 23, 1990

[51] Int. Cl.$^5$ .............................................. G08B 21/00
[52] U.S. Cl. .................................. 340/686; 340/540; 340/680; 250/561
[58] Field of Search ............... 340/540, 680, 686, 600; 250/560, 561, 206.1; 356/383, 387; 33/201, 501.5, 501.6, 626, DIG. 3; 408/11, 6; 409/218

[56] References Cited

U.S. PATENT DOCUMENTS

| | | | |
|---|---|---|---|
| 3,133,456 | 5/1964 | Martens | 408/006 |
| 3,133,457 | 5/1964 | Martens | 340/680 |
| 4,425,061 | 1/1984 | Kindl | 340/680 |
| 5,040,309 | 8/1981 | Hayden | 340/686 |

Primary Examiner—Jin F. Ng
Assistant Examiner—Christine K. Oda
Attorney, Agent, or Firm—Gregory G. Hendricks

[57] ABSTRACT

A drill collar position verifier for use with a drill bit having a drilling depth control collar positioned coaxially thereon. The drill bit is inserted in a cylindrical opening in a plastic block to a depth determined by the position of the collar. Three optical beam sources are positioned at three different predetermined depths in the plastic block. Each optical beam source projects an optical beam across the cylindrical opening and onto a corresponding optical beam detector, unless the drill bit breaks such optical beam projections. The optical beam detectors are connected to logic circuitry which is further connected to LED indicators. If the drill bit protrudes far enough through the plastic block to break the first but not the second and third optical beams, an LED is lit to indicate that the collar is positioned too close to the tip of the drill bit. If the drill bit protrudes far enough through the plastic block to break the first and second but not the third optical beam, an LED is lit to indicate that the collar is positioned within tolerances. And, if the drill bit protrudes far enough through the plastic block to break all three optical beams, an LED is lit to indicate that the collar is positioned too far away from the tip of the drill bit.

32 Claims, 3 Drawing Sheets

OPTICAL DRILL COLLAR POSITION VERIFIER

CROSS REFERENCE TO RELATED APPLICATION

The following U.S. patent application is related to the present invention:

Ser. No. 571,388, entitled "Drill Collar Position Verifier", filed on Aug. 23, 1990 in the names of Gary E. Hayden, John B. Portzer and Thomas G. Wojciechowsk, U.S. Pat. No. 5,040,309.

The inventions claimed in the present application and the related application were assigned to the same assignee.

FIELD OF THE INVENTION

The present invention relates to test equipment and more particularly to a test set which determines whether the longitudinal positioning of a collar, coaxially mounted on a drill bit, is within predetermined tolerances.

BACKGROUND OF THE INVENTION

Numerical Control drilling machines used for the drilling of printed circuit boards (PCBs) hold very tight tolerances in the X, Y and Z axes. The means of controlling the Z-axis drill depth is to use a drill bit with a plastic collar which has been coaxially positioned on the drill bit a predetermined distance from the drill tip. If this distance is set incorrectly, the depth of the drilled holes becomes incorrect and the quality of the PCB deteriorates.

The plastic collar is positioned on the drill bit by means of a mechanical plunger mechanism. The drill bit is first inserted into a holder. The operator then applies a force to a lever to activate the plunger and slide the plastic collar to the desired position. The plunger mechanism is calibrated periodically to attempt to maintain the collar's position within allowed tolerances. However, once the collar is so positioned on the drill bit, there is a need to be able to periodically verify the validity of the collar's position.

Accordingly, it is the object of the present invention to provide a novel test device which can be utilized to verify the longitudinal position of a collar coaxially mounted on a drill bit.

SUMMARY OF THE INVENTION

In accordance with the present invention, a drill collar position verifier for use with a drill having a collar coaxially positioned thereon is disclosed. The drill collar position verifier includes a housing and a drill receptacle cavity formed in the housing and having a diameter greater than that of the drill but less than the outside diameter of the collar. The drill is inserted into the drill receptacle cavity until the collar contacts the housing, thereby restricting further insertion of the drill into the drill receptacle cavity, whereby the drill becomes seated.

Also included is a depth detector positioned within the housing and in close proximity to the seated drill and operated in response to the drill being seated to detect, and generate a first depth signal representative of, the positioning of the collar within a predetermined range of distances from the tip of the drill. It is further operated in response to the drill being seated to detect, and generate a second depth signal representative of, the positioning of the collar outside that predetermined range of distances.

Indicators are also included and they are mounted to the housing and connected to the depth detectors and operated in response to the first depth signal to generate an indicating signal of a first characteristic and further operated in response to the second depth signal to generate an indicating signal of a second characteristic.

DESCRIPTION OF THE PREFERRED EMBODIMENT

Figure 1:
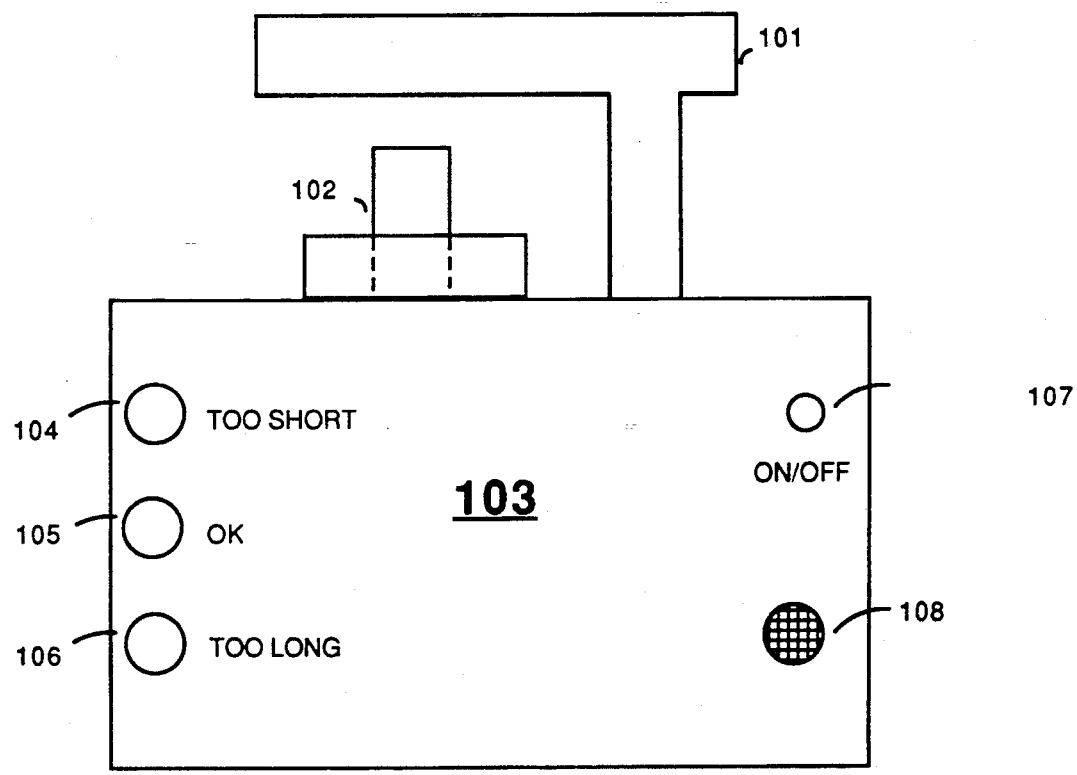
FIG. 1 of the accompanying drawing is a front view of the Optical Drill Collar Position Verifier of the present invention.

Referring now to FIG. 1 of the accompanying drawing, a front view of the Optical Drill Collar Position Verifier of the present invention is shown. Plunger 101 is shown with its handle portion positioned above drill bit 102 with collar 102a coaxially positioned thereon. The shaft portion of plunger 101 and drill bit 102 extend into housing 103. Light emitting diodes (LEDs) 104, 105 and 106 provide a visual indication as to whether the distance between collar 102a and the tip (drilling end of drill bit 102 is "Too Short", "OK" or "Too Long", respectively. Speaker 108 provides an audible tone whenever LED 104, 105 or 106 is lit, and ON/OFF switch 107 controls the application of electrical power within housing 103.

Figure 2:
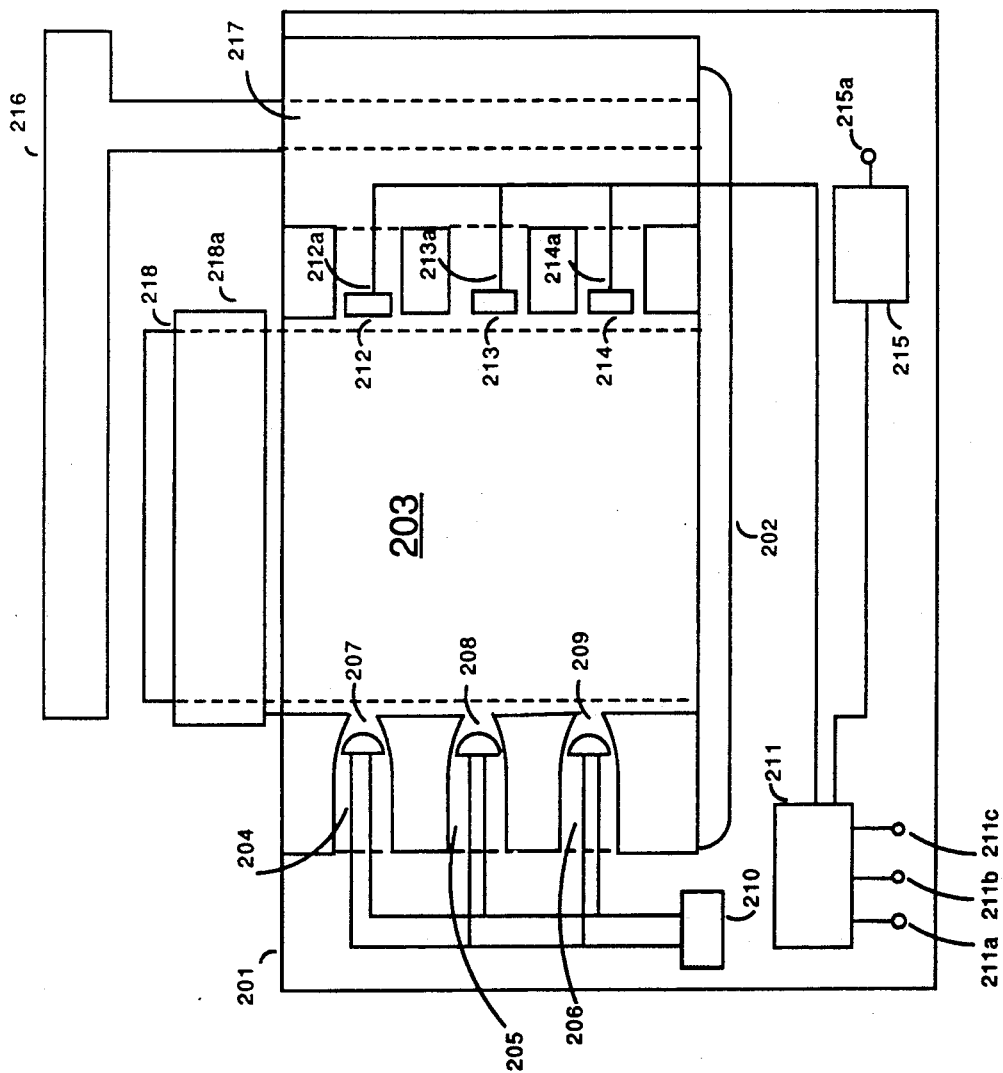
FIG. 2 of the accompanying drawing is a front view of the Optical Drill Collar Position Verifier of the present invention with the front cover removed.

Referring now to FIG. 2 of the accompanying drawing, a front view of the Optical Drill Collar Position Verifier of the present invention is shown with the front cover removed. Housing 201 encloses plastic block 202 (drill insertion guide means) which has cylindrical drill bit receptacle 203 extending into it. A corresponding opening is formed in housing 201 above drill bit receptacle 203. Chambers 204, 205 and 206 also extend into plastic block 202 and are perpendicular to drill bit receptacle 203. These chambers are used for the positioning of optical diodes 207, 208 and 209, respectively. Power supply 210 is shown connected to optical diodes 207, 208 and 209. However, the connections from power supply 210 to logic circuitry 211, optical detectors 212, 213 and 214, and to transducer 215 are not shown since such connections are obvious to those skilled in the art. Switch contacts associated with ON/OFF switch 107 (FIG. 1) are also not shown but are connected so as to enable and disable power supply 210. Logic circuitry 211 is connected to optical detectors 212, 213 and 214, which are mounted in chambers 212a, 213a and 214a, respectively. The output connections, 211a, 211b and 211c, of logic circuitry 211 are connected to LEDs 104, 105 and 106 (FIG. 1). Logic circuitry 211 is also connected to transducer 215 and its output connection, 215a, is connected to speaker 108 (FIG. 1). Plunger 216 is shown positioned in plunger receptacle 217 of plastic block 202 and it is also shown positioned above drill bit 218 which extends into drill bit receptacle 203. Collar 218a is also shown positioned on drill bit 218.

To initiate the verification of the position of collar 218a on drill bit 218, the drill bit is first positioned in drill bit receptacle 203. Plunger 216 is then positioned above drill bit 218 and caused to descend into plunger receptacle 217. As plunger 216 descends it also causes drill bit 218 to descend into drill bit receptacle 203. Drill bit 218 so descends until collar 218a contacts plastic block 202. Alternatively the opening in housing 201 above drill bit receptacle 203 could be of such a diameter that drill bit 218 descends until collar 218a contacts housing 201.

Power supply 210 provides power to optical diodes 207, 208 and 209 causing those diodes to emit optical beams into drill bit receptacle 203. Prior to insertion of drill bit 218 into drill bit receptacle 203, the optical beams from optical diodes 207, 208 and 209 are transmitted across drill bit receptacle 203 and are detected by optical detectors 212, 213 and 214. However, once drill bit 218 is inserted into drill bit receptacle 203, drill bit 218 may extend far enough into that receptacle to interrupt one or more of those optical beams.

Optical detectors 212, 213 and 214 provide optical detection signals representative of whether the optical beams from optical diodes 207, 208 and 209, respectively, are interrupted by the presence of drill bit 218. Logic circuitry 211 responds to those optical detection signals by causing the appropriate LED, "Too Short", "OK" or "Too Long", to be lit and by applying a transducer enable signal to transducer 215. Transducer 215 then causes speaker 108 (FIG. 1) to emit an audible signal concurrent with the visual LED signal.

Prior to insertion of drill bit 218 into drill bit receptacle 203, each of the three optical beams generated by optical diodes 207, 208 and 209 will be transmitted unimpeded across drill bit receptacle 203 and detected by optical detectors 212, 213 and 214, which then provide logic level 1 signals at their outputs. Logic circuitry 211 interprets these three logic level 1 signals as representing the absence of drill bit 218 in drill bit receptacle 203 and applies logic level 0 signals to outputs 211a, 211b and 211c, and to transducer 215. The logic level 0 signals on outputs 211a, 211b and 211c prevent LEDs 104, 105 and 106, respectively, (FIG. 1) from being lit, while the logic level signal applied to transducer 215 causes it to prevent speaker 108 (FIG. 1) from emitting an audible tone.

If drill bit 218 extends far enough into drill bit receptacle 203 to interrupt only the optical beam from optical diode 207, optical detector 212 will provide a logic level 0 signal at its output, while optical detectors 213 and 214 will provide logic level 1 signals at their outputs. Logic circuitry 211 interprets these three signals as indicating that the collar is positioned too close to the tip of the drill bit. Consequently, logic circuitry 211 applies a logic level 1 signal to 211c, and a logic level 1 signal to transducer 215. The logic level 1 signal on output 211a causes LED 104 to be lit, thereby providing the "Too Short" visual indication. The logic level 0 signals on outputs 211b and 211c prevent LEDs 105 and 106 from being lit, and the logic level 1 signal applied to transducer 215 enables it to cause speaker 108 to emit an audible tone concurrent with the illumination of LED 104.

If drill bit 218 extends far enough into drill bit receptacle 203 to interrupt the optical beams from optical diodes 207 and 208, optical detectors 212 and 213 will provide a logic level 0 signal at their outputs, while optical detector 214 will provide a logic level 1 signal at its output. Logic circuitry 211 interprets these three signals as indicating that the collar is positioned within the range of acceptable tolerances with respect to the tip of the drill bit. Consequently, logic circuitry 211 applies logic level 0 signals to outputs 211a and 211c, a logic level 1 signal to output 211b and a logic level 1 signal to transducer 215. The logic level 1 signal on output 211b causes LED 105 to be lit, thereby providing the "OK" visual indication. The logic level 0 signals on outputs 211a and 211c prevent LEDs 104 and 106 from being lit, and the logic level 1 signal applied to transducer 215 enables it to cause speaker 108 to emit an audible tone concurrent with the illumination of LED 105.

If drill bit 218 extends far enough into drill bit receptacle 203 to interrupt the optical beams from optical diodes 207, 208 and 209, optical detectors 212, 213 and 214 will provide a logic level 0 signal at their outputs. Logic circuitry 211 interprets these three signals as indicating that the collar is positioned too far from the tip of the drill bit. Consequently, logic circuitry 211 applies logic level 0 signals to outputs 211a and 211b, a logic level 1 signal to output 211c, and a logic level 1 signal to transducer 215. The logic level 1 signal on output 211c causes LED 106 to be lit, thereby providing the "Too Long" visual indication. The logic level 0 signals on outputs 211a and 211b prevent LEDs 104 and 105 from being lit, and the logic level 1 signal applied to transducer 215 enables it to cause speaker 108 to emit an audible tone concurrent with the illumination of LED 106.

Figure 3:
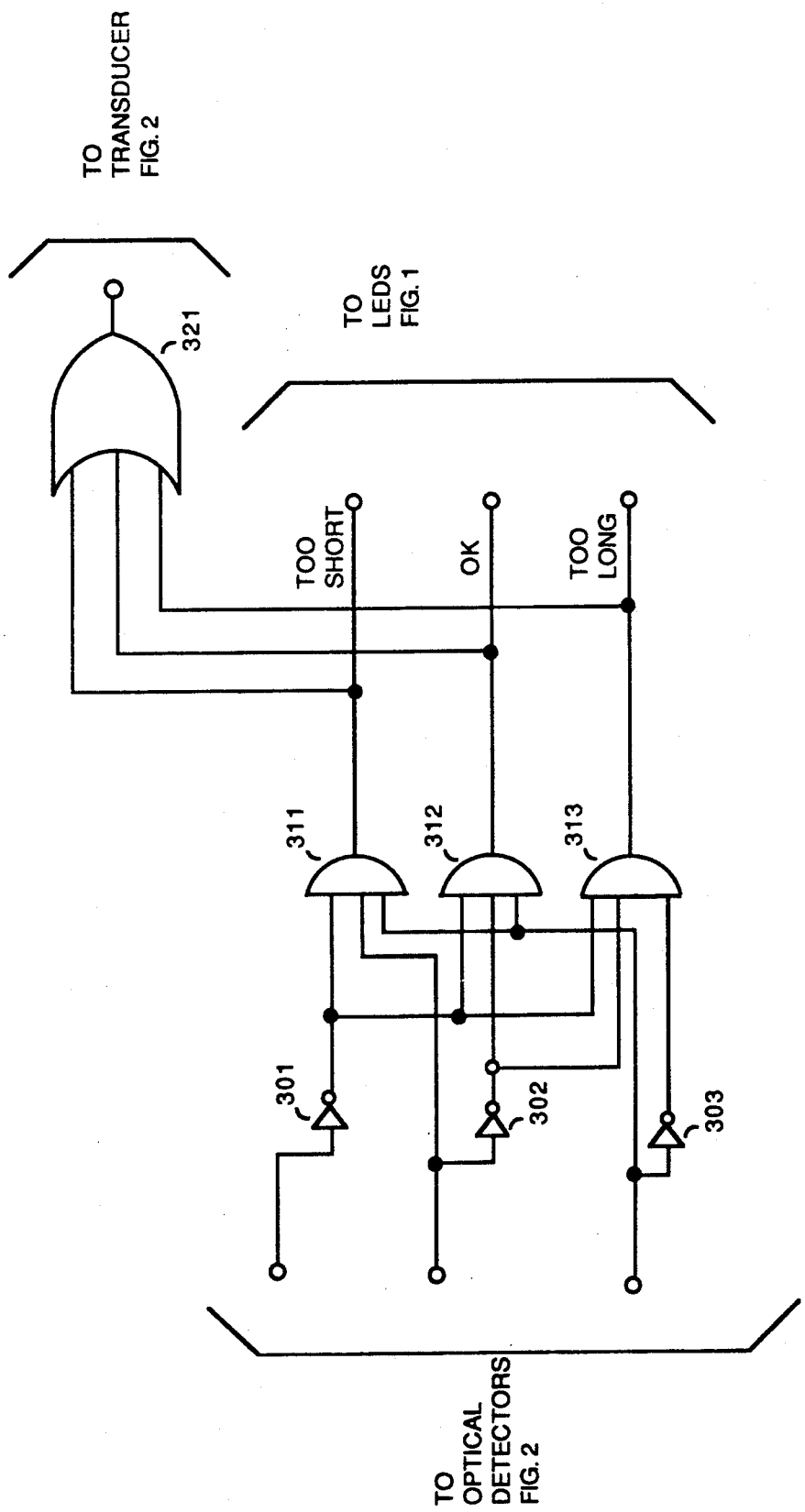
FIG. 3 of the accompanying drawing is a schematic diagram of the logic circuit of the Drill Collar Position Verifier of the present invention.

Referring now to FIG. 3 of the accompanying drawing, a schematic diagram of logic circuitry 211 of FIG. 2 is shown. The input of inverters 301, 302 and 303 is connected to optical detectors 212, 213 and 214 (FIG. 2). The output of inverter 301 is connected to the first input of AND gates 311, 312 and 313. The input of inverter 302 is connected to the second input of AND gate 311 and the output of that inverter is connected to the second input of AND gates 312 and 313. The input of inverter 303 is connected to the third input of AND gates 311 and 312, while the output of that inverter is connected to the third input of AND gate 313. The output of AND gate 311 is connected to the first input of OR gate 321 and to LED 104 (FIG. 1) which provides the "Too Short" visual indication. The output of AND gate 312 is connected to the second input of OR gate 321 and to LED 105 (FIG. 1) which provides the "OK" visual indication. The output of AND gate 313 is connected to the third input of OR gate 321 and to LED 106 (FIG. 1) which provides the "Too Long" visual indication. The output of OR gate 321 is connected to transducer 215 (FIG. 2) which causes speaker 108 (FIG. 1) to provide the audible indication associated with each visual indication.

Logic level 1 signals appear at the input of inverters 301, 302 and 303 if each of the optical detectors of FIG. 2 detect an optical beam. Such optical beams will be detected if a drill bit has not been inserted into the drill bit receptacle, so as to impede the optical beams. The logic level 1 signal appearing at the input of inverter 301 is inverted to a logic level 0 signal by that inverter. That logic level 0 signal is then applied to the first input of AND gates 311, 312 and 313 causing each of those gates to provide a logic level 0 signal at its output. Consequently, logic level 0 signals are applied by the AND gates to all three inputs of OR gate 321 and to the LEDs of FIG. 1. OR gate 321 then provides a logic level 0 signal at its output which causes transducer 215 (FIG. 2) to prevent speaker 108 (FIG. 1) from emitting an audible tone. Simultaneously, the logic level 0 signals appearing at LEDs 104, 105 and 106 (FIG. 1) prevent them from being lit.

The optical detectors of FIG. 2 apply a logic level 0 signal to inverter 301 and logic level 1 signals to inverters 302 and 303 when drill bit 218 (FIG. 2) extends far enough into drill bit receptacle 203 (FIG. 2) to impede only the optical beam from optical diode 207 (FIG. 2). Inverter 301 inverts the logic level 0 signal appearing at its input to a logic level 1 signal and applies it to the first input of AND gate 311. The logic level 1 signal appearing at the input of inverters 302 and 303 also appear at the second and third inputs, respectively, of AND gate 311. Since logic level 1 signals appear at all three inputs of AND gate 311 that gate applies a logic level 1 (Too Short) signal to LED 104 (FIG. 1). The logic level 1 signal appearing at the output of AND gate 311 also appears at an input of OR gate 321. That gate then applies a logic level 1 signal to transducer 215 (FIG. 2) which causes speaker 108 (FIG. 1) to emit an audible tone. Inverters 302 and 303 invert the logic level 1 signal appearing at their inputs to logic level 0 signals which are then applied to AND gates 312 and 313 causing them to provide logic level 0 signals at their outputs. Those logic level 0 signals prevent optical diodes 105 and 106 (FIG. 1) from being lit.

The optical detectors of FIG. 2 apply logic level 0 signals to inverters 301 and 302 and a logic level 1 signal to inverter 303 when drill bit 218 (FIG. 2) extends far enough into drill bit receptacle 203 (FIG. 2) to impede the optical beam from optical diodes 207 and 208 (FIG. 2). Inverter 301 inverts the logic level 0 appearing at its input to a logic level 1 signal and applies it to the first input of AND gate 312. Inverter 302 inverts the logic level 0 signal appearing at its input to a logic level 1 signal and applies it to the second input of AND gate 312. The logic level 1 signal appearing at the input of inverter 303 also appears at the third input of AND gate 313. Since logic level 1 signals appear at all three inputs of AND gate 312 that gate applies a logic level 1 (OK) signal to LED 105 (FIG. 1). The logic level 1 signal appearing at the output of AND gate 312 also appears at the input of OR gate 321. That gate then applies a logic level 1 signal to transducer 215 (FIG. 2) which causes speaker 108 (FIG. 1) to emit an audible tone. The logic level 0 signal appearing at the input of inverter 302 also appears at the second input of AND gate 311 causing it to provide a logic level 0 signal at its output. Also, inverter 303 inverts the logic level 1 signal appearing at its input to a logic level 0 signal and applies it to the third input of AND gate 313 which then provides a logic level 0 signal at its output. The logic level 0 signals appearing at the outputs of AND gates 311 and 313 prevent optical diodes 104 and 106 (FIG. 1) from being lit.

The optical detectors of FIG. 2 apply a logic level 0 signal to inverters 301, 302 and 303 when drill bit 218 (FIG. 2) extends far enough into drill bit receptacle 203 (FIG. 2) to impede the optical beam from optical diodes 207, 208 and 209 (FIG. 2). Inverter 301 inverts the logic level 0 signal appearing at its input to a logic level 1 signal and applies it to the first input of AND gate 313. Inverter 302 inverts the logic level 0 signal appearing at its input to a logic level 1 signal and applies it to the second input of AND gate 313. Inverter 303 also inverts the logic level 0 signal appearing at its input and applies it to the third input of AND gate 313. Since logic level 1 signals appear at all three inputs of AND gate 313 that gate applies a logic level 1 (Too Long) signal to LED 106 (FIG. 1). The logic level 1 signal appearing at the output of AND gate 313 also appears at an input of OR gate 321. That gate then applies a logic level 1 signal to transducer 215 (FIG. 2) which causes speaker 108 (FIG. 1) to emit an audible tone. The logic level 0 signal appearing at the input of inverter 303 also appears at the third input of AND gates 311 and 312 causing them to provide logic level 0 signals at their outputs. Those logic level 0 signals prevent optical diodes 104 and 105 (FIG. 1) from being lit.

While AND gate 311 (FIG. 3) is shown having three inputs the input connected to the lower optical detector may be deemed superfluous since the lower optical beam cannot be interrupted unless the middle one is interrupted. Similarly, while AND gate 313 is included in FIG. 3, if it were eliminated the Too Long indication could also be provided by inverter 303 since the lower optical beam cannot be interrupted unless the upper and middle beams are also interrupted.

Other embodiments of the present invention would obviously include replacement of LED indicators with audible or other types of visual indicators. Similarly, the three LED version of the present invention could also be replaced with two, or one light versions without departing from the spirit of the invention. For example, a two light version could be implemented with one light being lit for the "OK" indication and another for the Too Short and Too Long indications, i.e., out of tolerance. Such a multiple condition light could be connected to AND gates 311 and 313 (FIG. 3) in a wired "OR" or logical "OR" arrangement. A one light version would merely be turned on and off by AND gate 312 (FIG. 3) to provide the "OK" vs. "Too Short" or "Too Long" indications.

Another embodiment of the present invention would be a two light (LED) arrangement, as described above, with only two optical diode-detector pairs. With such an arrangement Inverter 301 and AND gates 311 and 313 would not be used. The Too Short condition would then occur when the upper optical beam is not interrupted by the seated drill bit (Input to Inverter 302). The OK condition would occur when the upper optical beam is interrupted but the lower beam is not (Output of AND gate 312). And, the Too Long condition would occur when the lower optical beam is interrupted by the seated drill bit (Output of Inverter 303). With such an arrangement ON/OFF switch 107 (FIG. 1) would be connected so as to represent a test enable function in order to inhibit the Too Short indication when a drill bit has not been inserted into the drill bit receptacle. An even more simplified arrangement would result if inverter 303 were also not used. Inverter 302 and AND gate 312 would then be used to provide the "OK" signal and a not "OK" signal, representing collar positions within and outside the predetermined range, respectively, since AND gate 311 would then be connected to one optical detector via inverter 301 and it would be directly connected to the other optical detector.

Thus the optical drill position verifier of the present invention represents a novel structure for determining whether a collar is positioned coaxially along the shaft of a drill bit at a location within predetermined tolerances or whether the collar is positioned too close or too far from the tip of the drill bit.

It will be obvious to those skilled in the art that numerous modifications of the present invention can be made without departing from the spirit of the invention which shall be limited only by the scope of the claims appended hereto.

What is claimed is:

1. An optical depth detector included in a drill collar position verifier for use with a drill having a collar coaxially positioned thereon, said drill collar position verifier comprising a housing, a drill receptacle cavity formed in said housing and having a diameter greater than that of said drill but less than the outside diameter of said collar, said drill being inserted into said drill receptacle cavity until said collar contacts said housing, thereby restricting further insertion of said drill into said drill receptacle cavity, whereby said drill becomes seated, and optical depth detection means positioned within said housing and in close proximity to said seated drill and operated in response to said drill being seated to detect, and generate a first depth signal representative of, the positioning of said collar within a predetermined range of distances from the tip of said drill, and further operated in response to said drill being seated to detect, and generate a second depth signal representative of, the positioning of said collar outside said predetermined range, said optical depth detector comprising:

first light transmission means positioned a first predetermined distance from the collar of said seated drill and operated to transmit a first light beam into said cavity, and further operated to detect the transmission of said first light beam across said cavity, when uninterrupted by said seated drill, and in response thereto, generate a first sensor signal of a first characteristic and further operated to detect the interruption of said first light beam by said seated drill and generate a first sensor signal of a second characteristic in response thereto;

second light transmission means positioned a second predetermined distance from the collar of said seated drill and operated to transmit a second light beam into said cavity, and further operated to detect the transmission of said second light beam across said cavity, when uninterrupted by said seated drill, and generate a second sensor signal of a first characteristic in response thereto, and further operated to detect the interruption of said second light beam by said seated drill and generate a second sensor signal of a second characteristic in response thereto; and logic means connected to said first and second light transmission means and operated in response to said first sensor signal of a second characteristic and said second sensor signal of a first characteristic to generate said first depth signal, and further operated in response to said first sensor signal of a first characteristic to generate said second depth signal, and further operated in response to said second sensor signal of a second characteristic to generate said second depth signal.

2. An optical depth detector as claimed in claim 1, wherein said first light transmission means comprises:
a first optical diode and a first optical detector, both positioned in optical alignment with each other and on opposite sides of said drill receptacle cavity.

3. An optical depth detector as claimed in claim 1, wherein said second light transmission means comprises:
a second optical diode and a second optical detector, both positioned in optical alignment with each other and on opposite sides of said drill receptacle cavity.

4. An optical depth detector as claimed in claim 1, wherein said logic means comprises:
an inverter having its input connected to said first light transmission means, and an AND gate having a first input connected to the output of said inverter and a second input connected to said second light transmission means, whereby said AND gate generates said first and second depth signals.

5. An optical depth detector included in a drill collar position verifier for use with a drill having a collar coaxially positioned thereon, said drill collar position verifier comprising a housing, a drill receptacle cavity formed in said housing and having a diameter greater than that of said drill but less than the outside diameter of said collar, said drill being inserted into said drill receptacle cavity until said collar contacts said housing, thereby restricting further insertion of said drill into said cavity, whereby said drill becomes seated, and optical depth detection means positioned within said housing and in close proximity to said seated drill and operated in response to said drill being seated to detect, and generate a first depth signal representative of, the positioning of said collar within a predetermined range of distances from the tip of said drill, and further operated in response to said drill being seated to detect, and generate a second depth signal representative of, the positioning of said collar less than a predetermined range of distances from the tip of said drill, and further operated in response to said drill being seated to detect, and generate a third depth signal representative of, the positioning of said collar more than a predetermined range of distances from the tip of said drill, said optical depth detector comprising:

first light transmission means positioned a first predetermined distance from the collar of said seated drill and operated to transmit a first light beam into said cavity, and further operated to detect the transmission of said first light beam across said cavity, when uninterrupted by said seated drill, and in response thereto, generate a first sensor signal of a first characteristic and further operated to detect the interruption of said first light beam by said seated drill and generate a first sensor signal of a second characteristic in response thereto;

second light transmission means positioned a second predetermined distance from the collar of said seated drill and operated to transmit a second light beam into said cavity, and further operated to detect the transmission of said second light beam across said cavity, when uninterrupted by said seated drill, and generate a second sensor signal of a first characteristic in response thereto, and further operated to detect the interruption of said second light beam by said seated drill and generate a second sensor signal of a second characteristic in response thereto; and logic means connected to said first and second light transmission means and operated in response to said first sensor signal of a second characteristic and said second sensor signal of a first characteristic to generate said first depth signal, and further operated in response to said first sensor signal of a first characteristic to generate said second depth signal, and further operated in response to said second sensor signal of a second characteristic to generate said third depth signal.

6. An optical depth detector as claimed in claim 5, wherein said first light transmission means comprises:
a first optical diode and a first optical detector, both positioned in optical alignment with each other and on opposite sides of said drill receptacle cavity.

7. An optical depth detector as claimed in claim 5, wherein said second light transmission means comprises:
a second optical diode and a second optical detector, both positioned in optical alignment with each other and on opposite sides of said drill receptacle cavity.

8. An optical depth detector as claimed in claim 5, wherein said logic means comprises:
first and second inverters each having its input connected to said first and second light transmission means, respectively and an AND gate having a first input connected to the output of said first inverter, and a second input connected to said second light transmission means, whereby said AND gate generates said first depth signal, said second depth signal is provided at the input of said first inverter and said second inverter generates said third depth signal.

9. An optical depth detector included in a drill collar position verifier for use with a drill having a collar coaxially positioned thereon, said drill collar position verifier comprising a housing, a drill receptacle cavity formed in said housing and having a diameter greater than that of said drill but less than the outside diameter of said collar, said drill being inserted into said drill receptacle cavity until said collar contacts said housing, thereby restricting further insertion of said drill into said cavity, whereby said drill becomes seated, and optical depth detection means positioned within said housing and in close proximity to said seated drill and operated in response to said drill being seated to detect, and generate a first depth signal representative of, the positioning of said collar within a predetermined range of distances from the tip of said drill, and further operated in response to said drill being seated to detect, and generate a second depth signal representative of, the positioning of said collar less than a predetermined range of distances from the tip of said drill, and further operated in response to said drill being seated to detect, and generate a third depth signal representative of, the positioning of said collar more than a predetermined range of distances from the tip of said drill, said optical depth detector comprising:
first light transmission means positioned a first predetermined distance from the collar of said seat drill and operated to transmit a first light beam into said cavity, and further operated to detect the transmission of said first light beam across said cavity, when uninterrupted by said seated drill, and in response thereto, generate a first sensor signal of a first characteristic and further operated to detect the interruption of said first light beam by said seated drill and generate a first sensor signal of a second characteristic in response thereto;
second light transmission means positioned a second predetermined distance from the collar of said seated drill and operated to transmit a second light beam into said cavity, and further operated to detect the transmission of said second light beam across said cavity, when uninterrupted by said seated drill, and generate a second sensor signal of a first characteristic in response thereto, and further operated to detect the interruption of said second light beam by said seated drill and generate a second sensor signal of a second characteristic in response thereto;
third light transmission means positioned a third predetermined distance from the collar of said seated drill and operated to transmit a third light beam into said cavity, and further operated to detect the transmission of said third light beam across said cavity, when uninterrupted by said seated drill, and generate a third sensor signal of a first characteristic in response thereto, and further operated, to detect the interruption of said third light beam by said seated drill and generate a third sensor signal of a second characteristic in response thereto; and
logic means connected to said first, second and third light transmission means and operated in response to said first sensor signal of a second characteristic, said second sensor signal of a second characteristic and said third sensor signal of a first characteristic to generate said first depth signal, and further operated in response to said first sensor signal of a second characteristic and said second sensor signal of a first characteristic to generate said second depth signal and further operated in response to said third sensor signal of a second characteristic to generate said third depth signal.

10. An optical depth detector as claimed in claim 9, wherein said first light transmission means comprises:
a first optical diode and a first optical detector, both positioned in optical alignment with each other and on opposite sides of said drill receptacle cavity.

11. An optical depth detector as claimed in claim 9, wherein said second light transmission means comprises:
a second optical diode and a second optical detector, both positioned in optical alignment with each other and on opposite sides of said drill receptacle cavity.

12. An optical depth detector as claimed in claim 9, wherein said third light transmission means comprises:
a third optical diode and a third optical detector, both positioned in optical alignment with each other and on opposite sides of said drill receptacle cavity.

13. An optical depth detector as claimed in claim 9, wherein said logic means comprises:
first, second and third inverters each having its input connected to said first, second and third light transmission means, respectively, a first AND gate having a first input connected to the output of said first inverter, and a second input connected to said second light transmission means, and a second AND gate having a first input connected to said second inverter, a second input connected to said first inverter and a third input connected to said third light transmission means, whereby said second AND gate generates said first depth signal, said first AND gate generates said second depth signal and said third inverter generates said third depth signal.

14. An optical depth detector as claimed in claim 9, wherein said logic means comprises:
first, second and third inverters, each having its input connected to said first, second and third light transmission means, a first AND gate having a first input connected to the output of said first inverter, a second input connected to said second light transmission means and a third input connected to said third light transmission means, a second AND gate having a first input connected to the output of said first inverter, a second input connected to the output of said second inverter and a third input connected said third light transmission means, and a third AND gate having first, second and third inputs connected to the output of said first, second and third inverters, respectively, whereby said second AND gate generates said first depth signal, said first AND gate generates said second depth signal and said third AND gate generates said third depth signal.

15. An optical depth detector as claimed in claim 9, wherein said indicating means comprises:
first, second and third light emitting diodes, which are turned on in response to said first, second and third depth signals, respectively.

16. An optical depth detector as claimed in claim 9, wherein said indicating means further comprises:
an OR gate connected to said optical depth detection means and operated in response to said first, second or third depth signals to generate a transducer enable signal, and an audible transducer connected to said OR gate and operated in response to said transducer enable signal to generate an audible signal.

17. An optical depth detector included in a drill collar position verifier for use with a drill having a collar coaxially positioned thereon, said drill collar position verifier comprising a housing having an opening of greater diameter than said drill collar, drill insertion guide means positioned within said housing and including a cylindrical cavity having a diameter greater than that of said drill but less than the outside diameter of said collar, said drill being inserted through said housing opening and into said drill insertion guide means until said collar contacts said drill insertion guide means, thereby restricting further insertion of said drill into said drill insertion guide means, whereby said drill becomes seated, and optical depth detection means positioned within said housing and in close proximity to said seated drill and operated in response to said drill being seated to detect, and generate a first depth signal representative of, the positioning of said collar within a predetermined range of distances from the tip of said drill, and further operated in response to said drill being seated to detect, and generate a second depth signal representative of, the positioning of said collar outside said predetermined range, said optical depth detector comprising:
first light transmission means positioned a first predetermined distance from the collar of said seated drill and operated to transmit a first light beam into said cavity, and further operated to detect the transmission of said first light beam across said cavity, when uninterrupted by said seated drill, and in response thereto, generate a first sensor signal of a first characteristic and further operated to detect the interruption of said first light beam by said seated drill and generate a first sensor signal of a second characteristic in response thereto;
second light transmission means positioned a second predetermined distance from the collar of said seated drill and operated to transmit a second light beam into said cavity, and further operated to detect the transmission of said second light beam across said cavity, when uninterrupted by said seated drill, and generate a second sensor signal of a first characteristic in response thereto, and further operated to detect the interruption of said second light beam by said seated drill and generate a second sensor signal of a second characteristic in response thereto; and
logic means connected to said first and second light transmission means and operated in response to said first sensor signal of a second characteristic and said second sensor signal of a first characteristic to generate said first depth signal, and further operated in response to said first sensor signal of a first characteristic to generate said second depth signal, and further operated in response to said second sensor signal of a second characteristic to generate said second depth signal.

18. An optical depth detector as claimed in claim 17, wherein said first light transmission means comprises:
a first optical diode and a first optical detector, both positioned in optical alignment with each other and on opposite sides of said drill receptacle cavity.

19. An optical depth detector as claimed in claim 17, wherein said second light transmission means comprises:
a second optical diode and a second optical detector, both positioned in optical alignment with each other and on opposite sides of said drill receptacle cavity.

20. An optical depth detector as claimed in claim 17, wherein said logic means comprises:
an inverter having its input connected to said first light transmission means, and an AND gate having a first input connected to the output of said inverter and a second input connected to said second light transmission means, whereby said AND gate generates said first and second depth signals.

21. An optical depth detector included in a drill collar position verifier for use with a drill having a collar coaxially positioned thereon, said drill collar position verifier comprising a housing having an opening of greater diameter than said drill collar, drill insertion guide means positioned within said housing and including a cylindrical cavity having a diameter greater than that of said drill but less than the outside diameter of said collar, said drill being inserted through said housing opening and into said drill insertion guide means until said collar contacts said drill insertion guide means, thereby restricting further insertion of said drill into said drill insertion guide means, whereby said drill becomes seated, and optical depth detection means positioned within said housing and in close proximity to said seated drill and operated in response to said drill being seated to detect, and generate a first depth signal representative of, the positioning of said collar within a predetermined range of distances from the tip of said drill, and further operated in response to said drill being seated to detect, and generate a second depth signal representative of, the positioning of said collar less than a predetermined range of distances from the tip of said drill and further operated in response to said drill being seated to detect, and generate a third depth signal representative of, the positioning of said collar more than a predetermined range of distances from the tip of said drill, said optical depth detector comprising:
first light transmission means positioned a first predetermined distance from the collar of said seated drill and operated to transmit a first light beam into said cavity, and further operated to detect the transmission of said first light beam across said cavity, when uninterrupted by said seated drill, and in response thereto, generate a first sensor signal of a first characteristic and further operated to detect the interruption of said first light beam by said seated drill and generate a first sensor signal of a second characteristic in response thereto;

second light transmission means positioned a second predetermined distance from the collar of said seated drill and operated to transmit a second light beam into said cavity, and further operated to detect the transmission of said second light beam across said cavity, when uninterrupted by said seated drill, and generate a second sensor signal of a first characteristic in response thereto, and further operated to detect the interruption of said second light beam by said seated drill and generate a second sensor signal of a second characteristic in response thereto; and logic means connected to said first and second light transmission means and operated in response to said first sensor signal of a second characteristic and said second sensor signal of a first characteristic to generate said first depth signal, and further operated in response to said first sensor signal of a first characteristic to generate said second depth signal, and further operated in response to said second sensor signal of a second characteristic to generate said third depth signal.

22. An optical depth detector as claimed in claim 21, wherein said first light transmission means comprises:
a first optical diode and a first optical detector, both positioned in optical alignment with each other and on opposite sides of said drill receptacle cavity.

23. An optical depth detector as claimed in claim 21, wherein said second light transmission means comprises:
a second optical diode and a second optical detector, both positioned in optical alignment with each other and on opposite sides of said drill receptacle cavity.

24. An optical depth detector as claimed in claim 21, wherein said logic means comprises:
first and second inverters each having its input connected to said first and second light transmission means, respectively and an AND gate having a first input connected to the output of said first inverter, and a second input connected to said second light transmission means, whereby said AND gate generates said first depth signal, said second depth signal is provided at the input of said first inverter and said second inverter generates said third depth signal.

25. An optical depth detector included in a drill collar position verifier for use with a drill having a collar coaxially positioned thereon, said drill collar position verifier comprising a housing having an opening of greater diameter than said drill collar, drill insertion guide means positioned within said housing and including a cylindrical cavity having a diameter greater than that of said drill but less than the outside diameter of said collar, said drill being inserted through said housing opening and into said drill insertion guide means until said collar contacts said drill insertion guide means, thereby restricting further insertion of said drill into said drill insertion guide means, whereby said drill becomes seated, and optical depth detection means positioned within said housing and in close proximity to said seated drill and operated in response to said drill being seated to detect, and generate a first depth signal representative of, the positioning of said collar within a predetermined range of distances from the tip of said drill, and further operated in response to said drill being seated to detect, and generate a second depth signal representative of, the positioning of said collar less than predetermined range of distances from the tip of said drill, and further operated in response to said drill being seated to detect, and generate a third depth signal representative of, the positioning of said collar more than a predetermined range of distances from the tip of said drill, said optical depth detector comprising:

first light transmission means positioned a first predetermined distance from the collar of said seated drill and operated to transmit a first light beam into said cavity, and further operated to detect the transmission of said first light beam across said cavity, when uninterrupted by said seated drill, and in response thereto, generate a first sensor signal of a first characteristic and further operated to detect the interruption of said first light beam by said seated drill and generate a first sensor signal of a second characteristic in response thereto;

second light transmission means positioned a second predetermined distance from the collar of said seated drill and operated to transmit a second light beam into said cavity, and further operated to detect the transmission of said second light beam across said cavity, when uninterrupted by said seated drill, and generate a second sensor signal of a first characteristic in response thereto, and further operated to detect the interruption of said second light beam by said seated drill and generate a second sensor signal of a second characteristic in response thereto;

third light transmission means positioned a third predetermined distance from the collar of said seated drill and operated to transmit a third light beam into said cavity, and further operated to detect the transmission of said third light beam across said cavity, when uninterrupted by said seated drill, and generate a third sensor signal of a first characteristic in response thereto, and further operated, to detect the interruption of said third light beam by said seated drill and generate a third sensor signal of a second characteristic in response thereto; and logic means connected to said first, second and third light transmission means and operated in response to said first sensor signal of a second characteristic, said second sensor signal of a second characteristic and said third sensor signal of a first characteristic to generate said first depth signal, and further operated in response to said first sensor signal of a second characteristic and said second sensor signal of a first characteristic to generate said second depth signal and further operated in response to said third sensor signal of a second characteristic to generate said third depth signal.

26. An optical depth detector as claimed in claim 25, wherein said first light transmission means comprises:
a first optical diode and a first optical detector, both positioned in optical alignment with each other and on opposite sides of said drill receptacle cavity.

27. An optical depth detector as claimed in claim 25, wherein said second light transmission means comprises:

a second optical diode and a second optical detector, both positioned in optical alignment with each other and on opposite sides of said drill receptacle cavity.

28. An optical depth detector as claimed in claim 25, wherein said third light transmission means comprises:
a third optical diode and a third optical detector, both positioned in optical alignment with each other and on opposite sides of said drill receptacle cavity.

29. An optical depth detector as claimed in claim 25, wherein said logic means comprises:
first, second and third inverters each having its input connected to said first, second and third light transmission means, respectively, a first AND gate having a first input connected to the output of said first inverter, and a second input connected to said second light transmission means, and a second AND gate having a first input connected to said second inverter, a second input connected to said first inverter and a third input connected to said third light transmission means, whereby said second AND gate generates said first depth signal, said first AND gate generates said second depth signal and said third inverter generates said third depth signal.

30. An optical depth detector as claimed in claim 25, wherein said logic means comprises:
first, second and third inverters, each having its input connected to said first, second and third light transmission means, a first AND gate having a first input connected to the output of said first inverter, a second input connected to said second light transmission means and a third input connected to said third light transmission means, a second AND gate having a first input connected to the output of said first inverter, a second input connected to the output of said second inverter and a third input connected said third light transmission means, and a third AND gate having first, second and third inputs connected to the output of said first, second and third inverters, respectively, whereby said second AND gate generates said first depth signal, said first AND gate generates said second depth signal and said third AND gate generates said third depth signal.

31. An optical depth detector as claimed in claim 25, wherein said indicating means comprises:
first, second and third light emitting diodes, which are turned on in response to said first, second and third depth signals, respectively.

32. An optical depth detector as claimed in claim 25, wherein said indicating means further comprises:
an OR gate connected to said optical depth detection means and operated in response to said first, second or third depth signals to generate a transducer enable signal, and an audible transducer connected to said OR gate and operated in response to said transducer enable signal to generate an audible signal.

* * * * *